(12) United States Patent
Toyoda et al.

(10) Patent No.: US 11,842,830 B2
(45) Date of Patent: Dec. 12, 2023

(54) CURRENT DETECTION RESISTOR

(71) Applicant: KOA Corporation, Nagano (JP)

(72) Inventors: Susumu Toyoda, Nagano (JP); Shuhei Matsubara, Nagano (JP); Keishi Nakamura, Nagano (JP)

(73) Assignee: KOA Corporation, Nagano (JP)

( * ) Notice: Subject to any disclaimer, the term of this patent is extended or adjusted under 35 U.S.C. 154(b) by 114 days.

(21) Appl. No.: 17/602,120

(22) PCT Filed: Mar. 3, 2020

(86) PCT No.: PCT/JP2020/008983
§ 371 (c)(1),
(2) Date: Oct. 7, 2021

(87) PCT Pub. No.: WO2020/213273
PCT Pub. Date: Oct. 22, 2020

(65) Prior Publication Data
US 2022/0148769 A1    May 12, 2022

(30) Foreign Application Priority Data

Apr. 17, 2019   (JP) .................................. 2019-078735

(51) Int. Cl.
*H01C 7/13*       (2006.01)
*G01R 15/14*      (2006.01)
(Continued)

(52) U.S. Cl.
CPC ............. *H01C 7/13* (2013.01); *G01R 15/144* (2013.01); *G01R 15/146* (2013.01); *G01R 19/0023* (2013.01); *H01C 1/144* (2013.01)

(58) Field of Classification Search
CPC ........ H01C 7/13; H01C 1/144; G01R 15/144; G01R 15/146; G01R 19/0023
See application file for complete search history.

(56) References Cited

U.S. PATENT DOCUMENTS

| | | | |
|---|---|---|---|
| 8,183,976 B2 * | 5/2012 | Lo ........................ | H01C 1/148 338/320 |
| 8,779,887 B2 * | 7/2014 | Lo ........................ | H01C 7/13 338/320 |

(Continued)

FOREIGN PATENT DOCUMENTS

| | | | |
|---|---|---|---|
| CN | 102811603 A | | 12/2012 |
| JP | 2012001402 A | * | 1/2012 |
| JP | 2018-170478 A | | 11/2018 |

OTHER PUBLICATIONS

JP2012001402, machine translation. (Year: 2012).*
International Search Report, Application No. PCT/JP2020/008983, dated Jun. 16, 2020. ISA/Japan Patent Office.

*Primary Examiner* — Kyung S Lee
(74) *Attorney, Agent, or Firm* — Honigman LLP (57) ABSTRACT

A shunt resistor 10, 110 includes a flat resistive element 11; a first electrode block 12 that is made of a conductive metal material and is laminated on a lower surface 11a of the resistive element 11; and a second electrode block 13, 113 that is made of a conductive metal material and is laminated on an upper surface 11b of the resistive element 11, in which the second electrode block 13, 113 is a block body including an electrode portion 14 connected to the resistive element 11 and an extension portion 15, 115 extending downward from a side surface of the electrode portion 14.

9 Claims, 7 Drawing Sheets

(51) Int. Cl.
    *G01R 19/00*     (2006.01)
    *H01C 1/144*     (2006.01)

(56) References Cited

U.S. PATENT DOCUMENTS

| | | | |
|---|---|---|---|
| 9,343,208 B2* | 5/2016 | Tsukada | H01C 17/006 |
| 2004/0085180 A1* | 5/2004 | Juang | H01C 17/006 |
| | | | 338/20 |
| 2013/0187749 A1* | 7/2013 | Tsukada | G01R 1/203 |
| | | | 29/610.1 |
| 2015/0323567 A1* | 11/2015 | Kitahara | G01R 19/15 |
| | | | 324/126 |
| 2020/0051717 A1* | 2/2020 | Nakamura | H01C 1/01 |

* cited by examiner

CURRENT DETECTION RESISTOR

CROSS-REFERENCE TO RELATED APPLICATIONS

This application is the U.S. national stage of PCT/JP2020/008983 filed on Mar. 3, 2020, which claims priority of Japanese Patent Application No. JP 2019-078735 filed on Apr. 17, 2019, the contents of which are incorporated herein.

TECHNICAL FIELD

The present disclosure relates to a current detection resistor.

BACKGROUND

JP2018-170478A discloses a current detection resistor having a first terminal, a second terminal, and a resistive element disposed between the first terminal and the second terminal, laminated in a thickness direction.

SUMMARY

In the current detection resistor of a vertical type as described above, a terminal on the upper side is connected to the wiring via a bonding wire, and needs to be connected to a plurality of bonding wires when the current detection resistor is used for detecting a relatively large current. The terminal needs to have a large area to have the plurality of bonding wires thus connected thereto without hindrance, but this may result in an increase in the size of the current detection resistor.

The present disclosure is made in view of such problem described above, and an object of the present disclosure is to downsize a current detection resistor used for detecting a relatively large current.

According to an aspect of the present disclosure, a current detection resistor includes: a flat resistive element; a first electrode block that is made of a conductive metal material and is laminated on a lower surface of the resistive element; and a second electrode block that is made of a conductive metal material and is laminated on an upper surface of the resistive element, in which the second electrode block is a block body including an electrode portion connected to the resistive element and an extension portion extending downward from a side surface of the electrode portion.

According to this aspect, the second electrode block including the extension portion extending downward connects the upper surface of the resistive element to a wiring pattern on a substrate. With the resistive element and the wiring pattern connected to each other using the block body instead of using a bonding wire, a current detection resistor of a vertical type used for detecting a relatively large current can be downsized.

DETAILED DESCRIPTION OF PREFERRED EMBODIMENTS

An embodiment of the present disclosure will be described below with reference to the attached drawings.

First Embodiment

A current detection resistor 10 (hereinafter, referred to as "shunt resistor 10") according to a first embodiment of the present disclosure will be described with reference to FIGS. 1 to 4.

Figure 1:
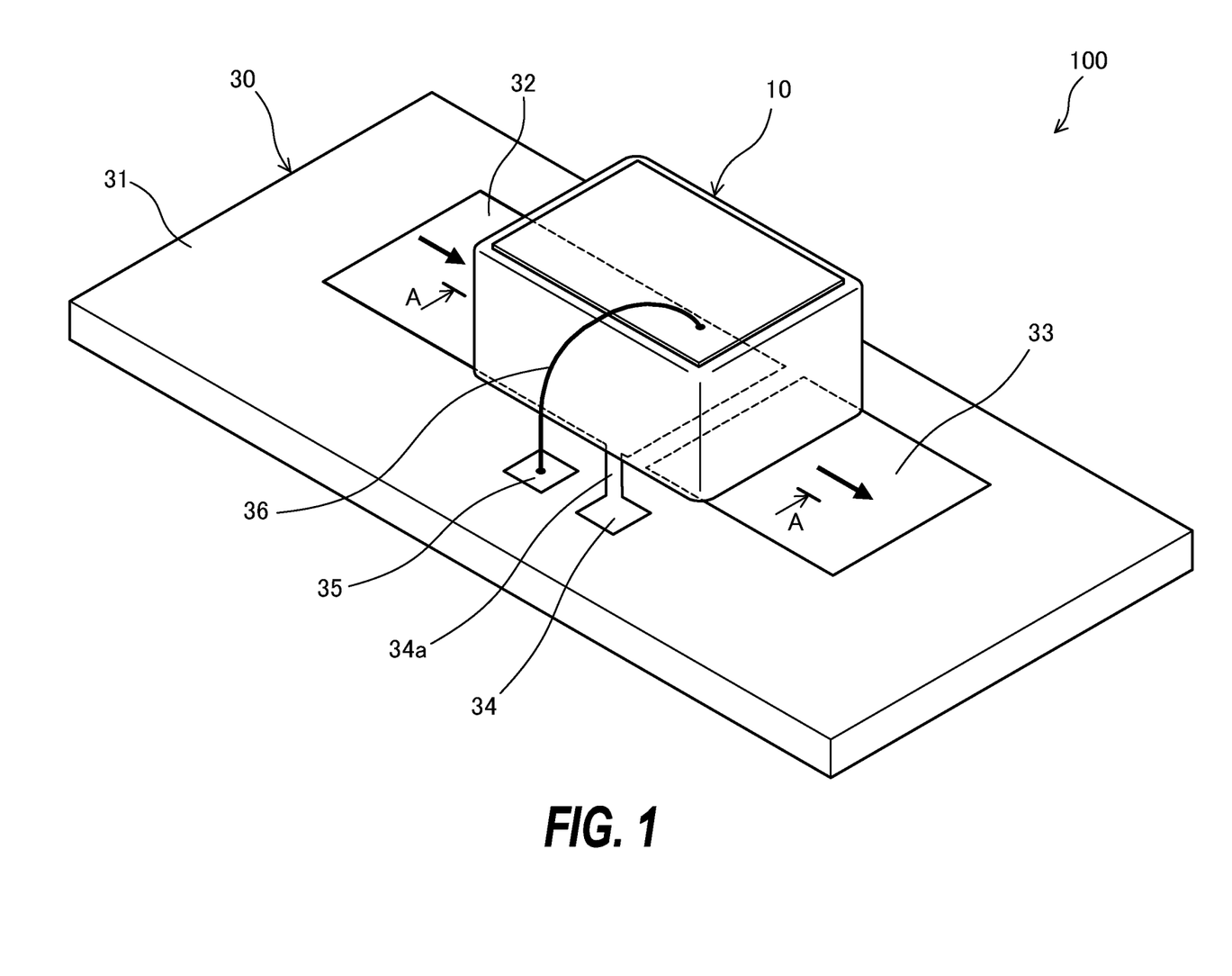
FIG. 1 is a perspective view illustrating a mount structure for a current detection resistor according to a first embodiment of the present disclosure.
Figure 2:
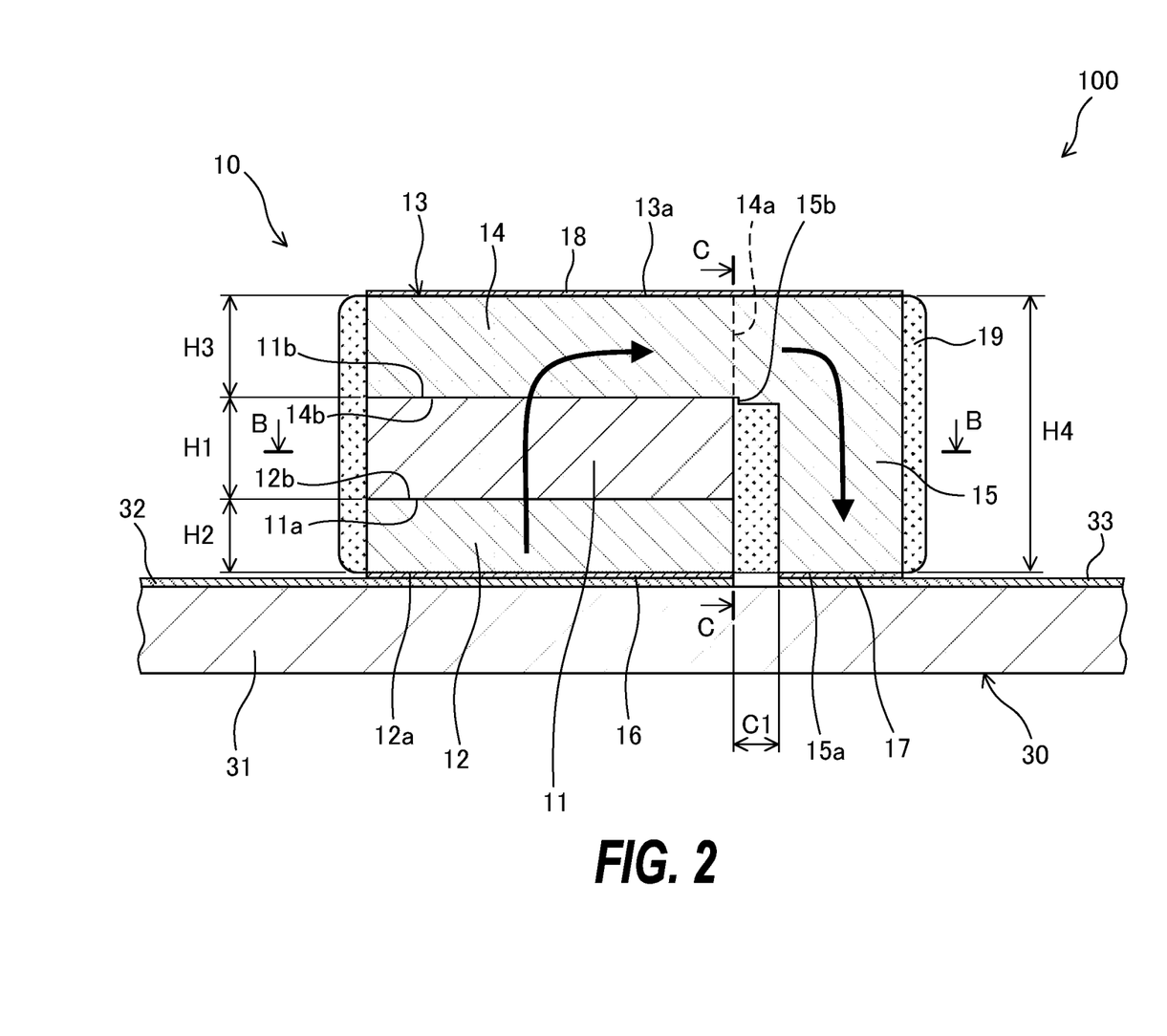
FIG. 2 is a cross-sectional view illustrating a cross section taken along line A-A in FIG. 1.
Figure 3:
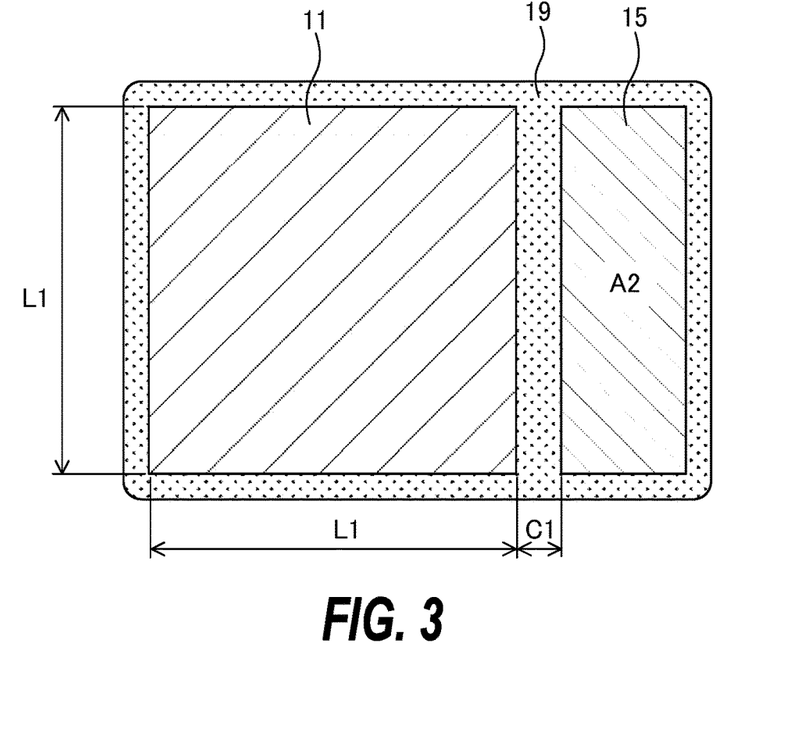
FIG. 3 is a cross-sectional view illustrating a cross section taken along line B-B in FIG. 2.
Figure 4:
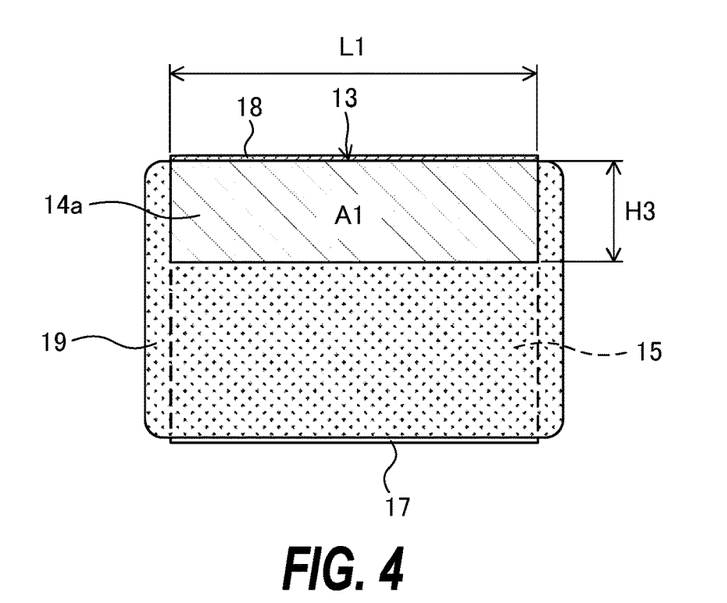
FIG. 4 is a cross-sectional view illustrating a cross section taken along line C-C in FIG. 2.

FIG. 1 is a perspective view illustrating a mount structure 100 having the shunt resistor 10 mounted on a circuit board 30 according to the first embodiment. FIG. 2 is a cross-sectional view illustrating a cross section taken along line A-A in FIG. 1. FIG. 3 is a cross-sectional view illustrating a cross section taken along line B-B in FIG. 2. FIG. 4 is a cross-sectional view illustrating a cross section taken along line C-C in FIG. 2.

The shunt resistor 10 is a resistor used for current detection, is provided to a power module for example, and is used for detecting a relatively large current of about several tens of amperes to several hundreds of amperes for example. In the mount structure 100 illustrated in FIG. 1, the shunt resistor 10 is mounted on the circuit board 30 including a circuit in which a relatively large current flows.

The circuit board 30 includes: a substrate 31 including a glass epoxy substrate, a ceramic substrate, or a metal core substrate for example; and a first wiring pattern 32 and a second wiring pattern 33 that are wiring formed on one surface of the substrate 31 by a conductive pattern of a copper foil or the like. The first wiring pattern 32 and the second wiring pattern 33 are formed to extend in directions to face each other while being separated from each other by a predetermined gap. Later described electrode blocks 12 and 13 of the shunt resistor 10 are respectively connected to the first wiring pattern 32 and the second wiring pattern 33, and current flows in a direction indicated by the arrows in FIG. 1. Note that this is an example of the current direction, and thus should not be construed in a limiting sense. The current may flow in the opposite direction.

The shunt resistor 10 includes a resistive element 11 that is flat in a vertical direction, and the first electrode block 12 and the second electrode block 13 that are formed by a metal material with conductivity. As illustrated in FIG. 2, the first electrode block 12 is stacked on the lower surface 11a of the resistive element 11, and the second electrode block 13 is stacked on an upper surface 11b of the resistive element 11.

With the electrodes thus stacked on the upper and the lower sides of the flat resistive element 11, the shunt resistor 10 is formed as a resistor of a vertical structure. In this Example, in the resistive element 11, current flowing from the first electrode block 12 disposed on the lower side toward the second electrode block 13 disposed on the upper side flows as indicated by the arrows in FIG. 2.

The shunt resistor 10 of a vertical structure has a flat lower surface and thus can be easily mounted on the circuit board 30. Furthermore, the mounting density can be improved by reducing the area of the lower surface to reduce the mounted area. Furthermore, in the shunt resistor 10 of a vertical structure, the resistive element 11 is disposed in the vicinity of the substrate 31, with the first electrode block 12 made of metal provided in between. Thus, the heat produced by the resistive element 11 can be easily radiated through the substrate 31.

In the shunt resistor 10 of a vertical structure, a thickness H1 of the resistive element 11 in the current flowing direction may be reduced to reduce the self-inductance, whereby high-frequency current detection error due to inductance can be suppressed.

As illustrated in FIG. 2 and FIG. 3, the resistive element 11 has a substantially square cross-sectional shape orthogonal to the laminating direction, and is formed to be in a rectangular parallelepiped shape with a relatively small thickness H1 in the laminating direction. The resistive element 11 may also be formed to be in a cylindrical shape with a circular cross-sectional shape orthogonal to the laminating direction.

The thickness H1 of the resistive element 11 is set to be several millimeters (mm) or less, for example, about 0.2 mm, to achieve a small self-inductance value of the shunt resistor 10. On the other hand, a length L1 of one side of the resistive element 11 is set to be several millimeters, for example, about 3 mm, which is larger than the thickness H1 of the resistive element 11, to facilitate the mounting on the circuit board 30.

A current path in the shunt resistor 10 is in a direction along the thickness H1 of the resistive element 11, to be shorter than a current path in a general shunt resistor. Thus, a specific resistance (volume resistance value) of the resistive element 11 is set to be a value larger than the specific resistance of a single alloy used for a resistive material of the general shunt resistor.

When the shunt resistor 10 is used for detecting a relatively large current, the resistance value of the resistive element 11 is expected to be set to a value within a range from 50 μΩ to 1,000 μΩ both inclusive. Thus, as a resistive material forming the resistive element 11, one having a specific resistance (volume resistivity) settable to be within a range from 200 μΩ·cm to 30000 μΩ·cm both inclusive, which is larger than the specific resistance (from 50 μΩ to 100 μΩ both inclusive) of a resistive element in a general shunt resistor.

Specifically, to achieve set the resistance value of the resistive element 11 to be 50 μΩ with the thickness H1 of the resistive element 11 being 0.2 mm and with the length L1 of one side of the resistive element 11 being 3 mm, the specific resistance of the resistive element 11 is set to be about 225 μΩ·cm. Furthermore, to achieve set the resistance value of the resistive element 11 to be 1,000 μΩ with the thickness H1 of the resistive element 11 being 0.2 mm and with the length L1 of one side of the resistive element 11 being 3 mm, the specific resistance of the resistive element 11 is set to be about 4,500 μΩ·cm. Furthermore, with the specific resistance of the resistive element 11 set to be large, the thickness H1 of the resistive element 11 can be reduced if the resistance value remains the same. In this manner, the thickness H1 of the resistive element 11 can be changed by changing the magnitude of the specific resistance.

As such a resistive material, one formed by mixing powder of metallic body with conductivity and insulative particles that are insulative is used. More specifically, the resistive material is a sintered body obtained by sintering the metal powder for forming the metallic body and the insulative particles, and includes the insulative particles and the metallic body of a three-dimensional mesh form surrounding these insulative particles.

As the metal powder before the sintering, particles with an aspect ratio being within a range from 1.0 to 2.0 both inclusive are preferably used. As the metal powder, particles with a particle size within a range from 0.5 μm to 20 μm both inclusive can be used, and as the insulative particles, particles with a particle size within a range from 0.1 μm to 10 μm both inclusive can be used.

Now, the metallic body and the insulative particles forming the resistive material of the resistive element 11 will be described.

Metallic Body

As the metallic body of the resistive material of the resistive element 11, a resistive material of a general shunt resistor can be used. For securing the stability of the resistance characteristics, a metal material suitable for detecting large current which is, for example, an alloy involving a small change in resistance value due to a change in the temperature of the resistive element 11 is preferably used.

A specific example includes at least one alloy selected from resistive materials such as nichrome, Manganin (registered trademark), Zeranin (registered trademark), or copper nickel. In particular, for securing the resistance value of the resistive material, nichrome is preferably used. For the sake of workability, Manganin (registered trademark) is preferably used. Thus, the metallic body of the resistive material of the resistive element 11 is preferably formed using at least one selected from the group consisting of nichrome, copper manganese, and copper nickel.

This nichrome is a Ni—Cr alloy or an alloy including the same as a main component. Copper manganese is a Cu—Mn alloy or an alloy including the same as a main component. Copper nickel is a Cu—Ni alloy or an alloy including the same as a main component. Manganin (registered trademark) is a Cu—Mn—Ni alloy or an alloy including the same as a main component. Zeranin (registered trademark) is a Cu—Mn—Sn alloy or an alloy including the same as a main component.

Insulative Particles

As the insulative particles of the resistive material of the resistive element 11, a ceramic material featuring excellent heat resistance, in addition to insulative property can be used. For example, for suppressing generation of cracks at a joint portion due to thermal stress, at least one ceramic material selected from the group consisting of aluminum oxide (Al2O3), aluminum nitride (AlN), silicon nitride (Si3N4), and zirconia (ZrO2) may be used.

Among the ceramic materials described above, aluminum oxide (alumina) widely used as an insulative material is preferably used for the sake of heat dissipation and heat cycle durability. For an application requiring higher heat dissipation, aluminum nitride featuring high thermal conductivity is preferably selected. For an application requiring high heat cycle durability, silicon nitride is preferably selected.

Next, a method for manufacturing a resistive material of the resistive element 11 will be described.

The method for manufacturing a resistive material of the resistive element 11 includes a mixing step of mixing metal powder with conductivity (powder of metal) and insulative powder (powder of an insulating body) that are insulative. The method for manufacturing a resistive material of the resistive element 11 further includes a sintering step of sintering the mixture powder obtained by the mixing, while pressing the mixture powder by a uniaxial pressurization method under a predetermined temperature.

In the mixing step, metal powder with a melting point lower than the melting point of the insulative powder is used as the metal powder, and the metal powder is prepared to have a particle size that is equal to or smaller than the particle size of the insulative powder.

In the sintering step, for example, the mixture powder is pressed with a container for the mixture powder being in a near-vacuum state. The mixture powder may be pressed under an inactive atmosphere. A higher pressing pressure compromises the specific resistance of the resistive material of the resistive element 11, but is likely to contribute to securing a conductive path (current path) in which the current flows. In view of this, the pressing pressure is preferably set to be high. The predetermined temperature is a temperature lower than the melting point of a metal block, and is preferably set to a temperature that is about 15% lower than the melting point of the metal block.

With the manufacturing method described above, the metallic body is formed in a three-dimensional mesh form between the insulative particles in the resistive material of the resistive element 11.

The first electrode block 12 and the second electrode block 13 laminated on the resistive element 11 with the configuration described above are block bodies formed from a highly conductive metal material such as oxygen-free copper or an aluminum alloy. The first electrode block 12 is shaped to be capable of connecting the lower surface 11a of the resistive element 11 and the first wiring pattern 32, and the second electrode block 13 is shaped to be capable of connecting the upper surface 11b of the resistive element 11 and the second wiring pattern 33.

The first electrode block 12 has a form similar to that of the resistive element 11, that is, formed to be in a rectangular parallelepiped shape with a substantially square cross section, orthogonal to the laminating direction, and a relatively small thickness H2 in the laminating direction.

A plating layer 16 is formed on the lower surface 12a of the first electrode block 12 joined to the first wiring pattern 32. As the plating layer 16, tin (Sn) plating is provided to improve solder wettability for the mounting. To prevent the solder for the mounting from eroding the first electrode block 12, a nickel (Ni) plating layer may further be provided. As the plating layer 16, plating may be performed with material other than tin (Sn) or nickel (Ni), such as copper (Cu), silver (Ag), palladium (Pd), a silver-palladium (Ag—Pd) alloy, gold (Au), or gold-palladium (Au—Pd).

The resistive element 11 may be joined on the upper surface 12b of the first electrode block 12. The upper surface 12b and the resistive element 11 may be joined to each other by methods such as pressure welding between the resistive element 11 and a metal material such as Cu, or joining the resistive element 11 and the metal material to each other with a predetermined joining layer provided in between.

The second electrode block 13 is a block body in which an electrode portion 14 and an extension portion 15 are integrally formed. The electrode portion 14 is connected to the upper surface 11b of the resistive element 11 and the extension portion 15 extends downward from a side surface 14a of the electrode portion 14. The second electrode block 13 is formed to be in a substantially L shape in cross-sectional view illustrated in FIG. 2.

The electrode portion 14 has a shape similar to that of the resistive element 11, that is, formed to be in a rectangular parallelepiped shape with a substantially square cross section, orthogonal to the laminating direction, and a relatively small thickness H3 in the laminating direction. The resistive element 11 is joined to the lower surface 14b of the electrode portion 14. The lower surface 14b and the resistive element 11 may be joined to each other by methods such as pressure welding between the resistive element 11 and a metal material such as Cu, or joining the resistive element 11 and the metal material to each other with a predetermined joining layer provided in between.

The extension portion 15 includes a flat lower end surface 15a joined to the second wiring pattern 33. The extension portion 15 is a portion formed in a rectangular parallelepiped shape with a height H4 from the lower end surface 15a along the laminating direction being a sum be of the thickness H1 of the resistive element 11, the thickness H2 of the first electrode block 12, and the thickness H3 of the electrode portion 14. Thus, the second electrode block 13 is formed to have the lower end surface 15a of the extension portion 15 being located on the same plane as the lower surface 12a of the first electrode block 12.

A plating layer 17 is formed on the lower end surface 15a of the extension portion 15, as on the lower surface 12a of the first electrode block 12. As the plating layer 17, tin (Sn) plating is provided to improve solder wettability for the mounting. To prevent the solder for the mounting from eroding the second electrode block 13, a nickel (Ni) plating layer may further be provided. As the plating layer 17, plating may be performed with a material other than tin (Sn) or nickel (Ni), such as copper (Cu), silver (Ag), palladium (Pd), a silver-palladium (Ag—Pd) alloy, gold (Au), or gold-palladium (Au—Pd).

The extension portion 15 includes a portion extending in a direction orthogonal to the laminating direction from the side surface 14a of the electrode portion 14, so that a gap C1 of a predetermined size is formed between the resistive element 11 and the first electrode block 12, and the extension portion 15. This portion is provided with a regulating surface 15b to which the side surface on the upper surface 11b side of the resistive element 11, to prevent the size of the gap C1 from being smaller than the predetermined size. The regulation surface 15b may be a surface formed by a step as illustrated in FIG. 2, or may be a surface formed by a protrusion protruding downward. The regulation surface 15b may be used as a positioning guide when joining the resistive element 11 and the second electrode block 13 to each other. The size of the gap C1 is set in accordance with the required withstand voltage of the shunt resistor 10.

The second electrode block 13 with the above shape is formed in a block form by shaping a rod-shaped material into a shape with the electrode portion 14 and the extension portion 15 by rolling or the like, instead of bending a plate material.

For example, when the electrode portion 14 and the extension portion 15 are formed by bending a plate material, spring back occurs. As a result, a stable angle fails to be achieved between the electrode portion 14 and the extension portion 15, and thus the position of the lower end surface 15a of the extension portion 15 varies. When the position of the lower end surface 15a of the extension portion 15 thus varies, the lower end surface 15a of the extension portion 15 fails to be positioned on the same plane as the lower surface 12a of the first electrode block 12, leading to a larger terminal flatness. As a result, the contact state between the lower end surface 15a of the extension portion 15 and the second wiring pattern 33 becomes unstable due to degradation of the soldering strength. When this happens, a relatively large current may be difficult to flow in the shunt resistor 10.

On the other hand, when the electrode portion 14 and the extension portion 15 are formed in a block shape by rolling or the like, a stable angle can be easily achieved between the electrode portion 14 and the extension portion 15. Thus, the lower end surface 15a of the extension portion 15 can be easily positioned on the same plane as the lower surface 12a of the first electrode block 12, whereby a small terminal flatness can be achieved. As a result, a stable contact state can be achieved between the lower surface 12a of the first electrode block 12 and the first wiring pattern 32, and between the lower end surface 15a of the extension portion 15 and the second wiring pattern 33, whereby a relatively large current can flow in the shunt resistor 10. The method of shaping the second electrode block 13 is not limited to rolling, and any method, including cutting or pressing for example, may be employed as long as the shape described above can be obtained without involving spring back.

When the second electrode block 13 has the shape described above, the resistive element 11 is connected to the second wiring pattern 33 via the second electrode block 13. Thus, even when the shunt resistor 10 has a vertical structure, a plurality of bonding wires do not need to be connected for connecting the resistive element 11 to the second wiring pattern 33, whereby mountability of the shunt resistor 10 can be improved. Since a plurality of bonding wires need not to be connected, the electrode terminal can have a smaller area. As a result of the shunt resistor 10 can be downsized.

Compared with a case where the bonding wires are used, the resistance of a portion where the current flows after flowing in the resistive element 11 and the electrode portion 14 can be reduced in a case where the second electrode block 13 with the shape described above is used, whereby a relatively large current can flow in the shunt resistor 10.

In the shunt resistor 10, the resistive element 11, the first electrode block 12, and the second electrode block 13 are formed by molding an insulative material such as resin. Specifically, these are formed by molding to expose the lower surface 12a of the first electrode block 12, the upper surface 13a of the second electrode block 13, and the lower end surface 15a of the extension portion 15.

Such molding results in side surfaces of the resistive element 11, the first electrode block 12, and the second electrode block 13 covered by an insulative material 19 over the entire circumference, with the gap C1 between the resistive element 11 and the first electrode block 12 and the extension portion 15 filled with the insulative material 19.

The shunt resistor having a vertical structure may involve short circuiting between an upper side electrode and a lower side electrode, due to solder fillet formed when the shunt resistor is mounted. In the shunt resistor 10 of the present embodiment, the side surfaces of the resistive element 11, the first electrode block 12, and the second electrode block 13 are covered by the insulative material 19 as described above. Thus, no solder fillet is formed, whereby short circuiting between the first electrode block 12 and the second electrode block 13 can be prevented.

Here, also by attaching a member corresponding to the second electrode block 13 with the above described shape after mounting the first electrode block 12 and the resistive element 11 on the substrate 31, a relatively large current should be able to flow in the resistive element 11 without using a plurality of bonding wires. However, in this case, the number of mounting steps increases, and this may result in an increase in manufacturing cost or quality variation.

On the other hand, the shunt resistor 10 of the present embodiment has an integrated configuration obtained by the molding as described above, and thus can be easily mounted on the substrate 31 by soldering after being placed thereon. As described above, the shunt resistor 10 features excellent mountability and can be easily handled and managed, whereby the manufacturing cost of the mount structure 100 can be reduced.

When the integrated configuration is obtained by the molding, the gap C1 between the resistive element 11 and the first electrode block 12 and the extension portion 15 is also filled with the insulative material 19, whereby insulation between the first electrode block 12 and the second electrode block 13 can be improved.

The plating layer 18 is formed on the upper surface 13a of the second electrode block 13 exposed from the insulative material 19. As the plating layer 18, nickel (Ni) plating is provided to prevent erosion of the second electrode block 13 during wire bonding. As the plating layer 18, plating may be performed with a material other nickel (Ni), such as tin (Sn), copper (Cu), silver (Ag), palladium (Pd), a silver-palladium (Ag—Pd) alloy, or gold (Au).

Thus, the upper surface 13a of the second electrode block 13 is a bonding surface enabling wire bonding thereon. Specifically, on the upper surface 13a of the second electrode block 13, a connection wire 36 is formed by wire bonding, and a potential for detecting a voltage drop in the shunt resistor 10 is output through this connection wire 36.

On the other hand, as illustrated in FIG. 1, the substrate 31 of the circuit board 30 on which the shunt resistor 10 with the configuration described above is mounted is provided with a first voltage terminal 34 to which a potential on the upstream side of the shunt resistor 10 is guided and a second voltage terminal 35 to which a potential on the downstream side of the shunt resistor 10 is guided, for detecting the voltage drop in the shunt resistor 10.

The first voltage terminal 34 is arranged adjacent to the second wiring pattern 33 with a predetermined gap in between, and is connected to the first wiring pattern 32 via a connection wiring 34a extending in an oblique direction from the first wiring pattern 32.

The second voltage terminal 35 is arranged adjacent to the first wiring pattern 32 with a predetermined gap in between, and is connected to the second electrode block 13 of the shunt resistor 10 via the connection wire 36 formed by the wire bonding.

An unillustrated current detection device is connected to the first voltage terminal 34 and the second voltage terminal 35, detects a voltage drop in the shunt resistor 10 based on a voltage signal between the first voltage terminal 34 and the second voltage terminal 35, and calculates the value of current flowing in the shunt resistor 10 based on the detected voltage drop. The current detection device includes a signal processing unit such as an operational amplifier or a microcomputer for processing the voltage signal.

The connection wiring 34a provided on the substrate 31 and the connection wire 36 connecting the shunt resistor 10 and the substrate 31 to each other are arranged to cross each other in plan view of the circuit board 30.

With the connection wiring 34a and the connection wire 36, which are lead lines through which the voltage signal for detection is transmitted, spatially crossing, a loop area that is smaller than that in a case where these do not cross each other is formed between the connection wiring 34a and the connection wire 36. Thus, parasitic inductance produced in the connection wiring 34a and the connection wire 36 can be suppressed. As a result, the current detection device can detect the current with a higher accuracy.

To further downsize the shunt resistor 10 with the configuration described above, the thickness H3 of the electrode portion 14 may be reduced. However, reduction of the thickness H3 of the electrode portion 14 leads to an increase in the resistance, and thus may result in compromised current detection accuracy. Thus, the thickness H3 of the electrode portion 14 needs to be equal to or larger than a predetermined thickness.

An appropriate value of the thickness H3 of the electrode portion 14 will be considered below.

The resistance value of the resistive element 11 is expected to be set in the range from 50 μΩ to 1,000 μΩ both inclusive. To improve the current detection accuracy, the resistance value of the electrode portion 14 is set to be low as much as possible, and is specifically preferably set to be equal to or less than 10% of the resistance value of the resistive element 11.

The current flowing in the electrode portion 14 after passing through the resistive element 11 is headed toward the extension portion 15 as indicated by the arrows in FIG. 2. Thus, a resistance value R of the electrode portion 14 is obtained by the following Formula (1), where A1 represents the area of the side surface 14a as illustrated in FIG. 4.

FORMULA (1)

$$R = \rho^* L / A1 \quad (1)$$

Note that L in Formula (1) described above represents the length of the electrode portion 14 toward the side surface 14a, that is the length L1 of one side of the electrode portion 14, and p represents the specific resistance (1.7 μΩ·cm) of copper forming the electrode portion 14.

To set the resistance value R of the electrode portion 14 to be equal to or less than 5 μΩ with the resistance value of the resistive element 11 being 50 μΩ, when the length L1 of one side of the electrode portion 14 is 3 mm, the thickness H3 of the electrode portion 14 needs to be equal to or longer than 3.4 mm. To set the resistance value R of the electrode portion 14 to be equal to or less than 100 μΩ with the resistance value of the resistive element 11 being 1,000 μΩ, when the length L1 of one side of the electrode portion 14 is 3 mm, the thickness H3 of the electrode portion 14 needs to be equal to or longer than 0.17 mm.

With the thickness H3 of the electrode portion 14 thus changed in accordance with the resistance value of the resistive element 11, the current detection accuracy using the shunt resistor 10 with the above configuration can be improved.

In the shunt resistor 10 with the above configuration, the resistance value of the extension portion 15 leading to the electrode portion 14 is also reduced for further improving the current detection accuracy. Specifically, a cross-sectional area A2 of the cross section of the extension portion 15 extending in parallel with the laminating direction orthogonal to the laminating direction as illustrated in FIG. 3 is uniform across the section reaching the lower end surface 15a, and is set to be larger than a cross-sectional area A1 of the side surface 14a.

With the resistance value of the extension portion 15 in which the current flows after passing through the electrode portion 14 also reduced, the accuracy of the current detection using the shunt resistor 10 can be improved. The cross-sectional area A2 may be gradually increased toward the lower end surface 15a of the extension portion 15 to further reduce the resistance value of the extension portion 15. However, the gradual increase in the cross-sectional area A2 leads to a large mounting area of the shunt resistor 10, and thus the cross-sectional area A2 is preferably uniform across the section reaching the lower end surface 15a to achieve high mountability of the shunt resistor 10.

The first embodiment described above provides the following effects.

In the shunt resistor 10, the first electrode block 12 laminated on the lower surface 11a and the second electrode block 13 including the extension portion 15 extending downward connect the resistive element 11 arranged between the first electrode block 12 and the second electrode block 13 to the wiring patterns 32 and 33 on the substrate 31. In particular, the upper surface 11b of the resistive element 11 and the second wiring pattern 33 are connected to each other using the second electrode block 13 which is a block body, instead of using a connection wire formed by wire bonding.

With the upper surface 11b of the resistive element 11 and the second wiring pattern 33 connected to each other using the block body with a large cross-sectional area instead of using a connection wire with a small cross-sectional area, a current path in which a relatively large current can flow can be secured. As a result, the relatively large current can flow in the shunt resistor 10.

A plurality of connection wires need not to be bonded to the electrode provided on the upper surface 11b of the resistive element 11. Thus, the cross-sectional area of the resistive element 11 or the area of the electrode provided to the upper surface 11b of the resistive element 11 is reduced, whereby even the shunt resistor 10 used for detecting a relatively large current can be downsized. The shunt resistor 10 thus downsized can be mounted on the circuit board 30 with improved mountability.

Next, another mount structure for the shunt resistor 10 according to the first embodiment will be described with reference to FIG. 5.

Figure 5:
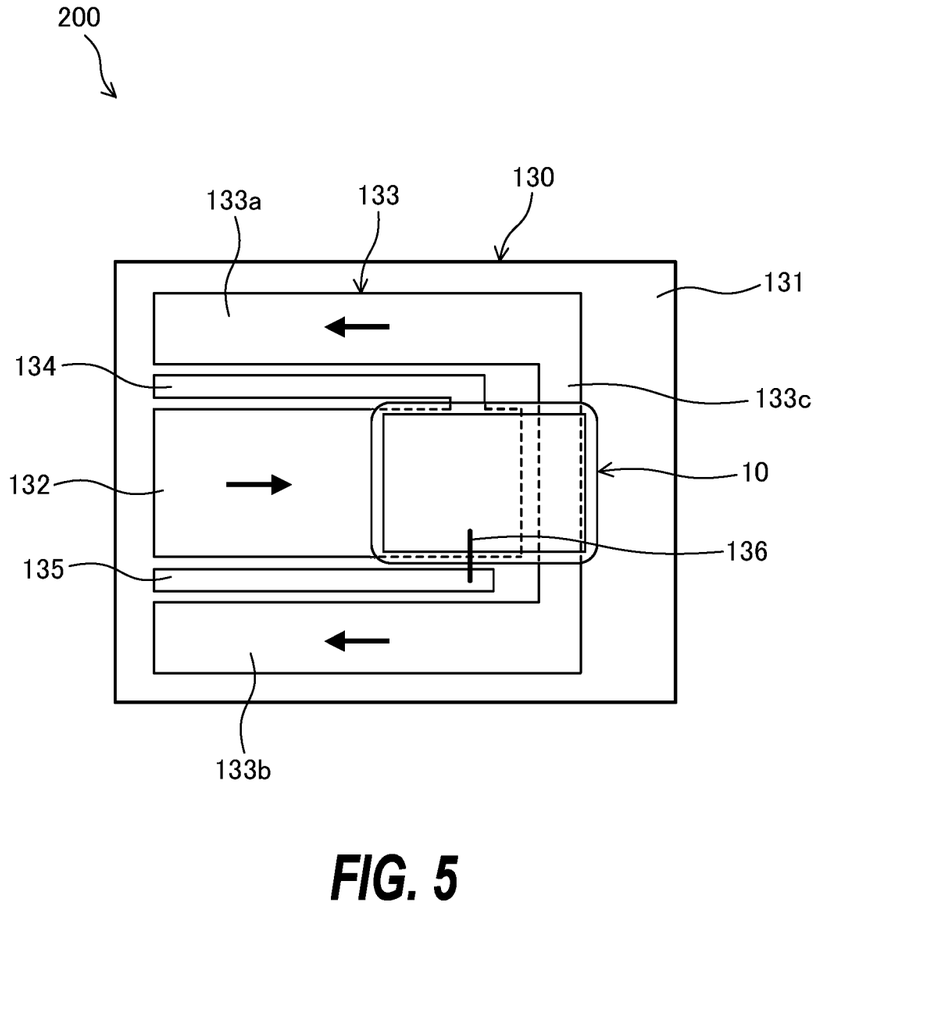
FIG. 5 is a diagram illustrating a modification of the mount structure for the current detection resistor according to the first embodiment of the present disclosure.

FIG. 5 illustrates a mount structure 200 different from the mount structure 100 described above. With this mount structure 200, the shunt resistor 10 with the configuration described above is mounted on a circuit board 130 different from the circuit board 30 described above.

The circuit board 130 includes a substrate 131 and a first wiring pattern 132 and a second wiring pattern 133 provided to the substrate 131. The second wiring pattern 133 includes a pair of branched patterns 133a and 133b extending in parallel with the linearly extending first wiring pattern 132 provided therebetween, and a connection pattern 133c connecting the pair of branched patterns 133a and 133b.

The substrate 131 is provided with a first voltage terminal 134 that is branched off from the first wiring pattern 132 and is provided between the first wiring pattern 132 and the branched pattern 133a that is one of the pair of branched patterns 133a and 133b, and a second voltage terminal 135 provided between the first wiring pattern 132 and the branched pattern 133b that is the other one of the pair of branched patterns 133a and 133b.

The shunt resistor 10 has the lower surface 12a of the first electrode block 12 connected to the first wiring pattern 132, and has the lower end surface 15a of the extension portion 15 connected to the connection pattern 133c of the second wiring pattern 133. With this configuration, the mounting on the circuit board 130 is implemented through connection between the second electrode block 13 and the second voltage terminal 135 via the connection wire 136 formed by the wire bonding.

As in the first embodiment described above, an unillustrated current detection device is connected to the first voltage terminal 134 and the second voltage terminal 135, and the value of the current flowing in the shunt resistor 10 as indicating by the arrows in FIG. 5 is calculated by the current detection device.

In this modification, the first wiring pattern 132 in which the current toward the shunt resistor 10 flows and the second wiring pattern 133 in which the current flows after passing through the shunt resistor 10 are arranged parallel with each other.

Thus, a magnetic flux produced by the current flowing in the first wiring pattern 132 and a magnetic flux produced by the current flowing in the pair of branched patterns 133a and 133b cancel each other out, whereby the inductance components of the first wiring pattern 132 and the second wiring pattern 133 are reduced. With the inductance components around the shunt resistor 10 thus reduced, the current detection accuracy can be improved even when high frequency current of 20 kHz or higher flows in the shunt resistor 10, for example.

Second Embodiment

Figure 6:
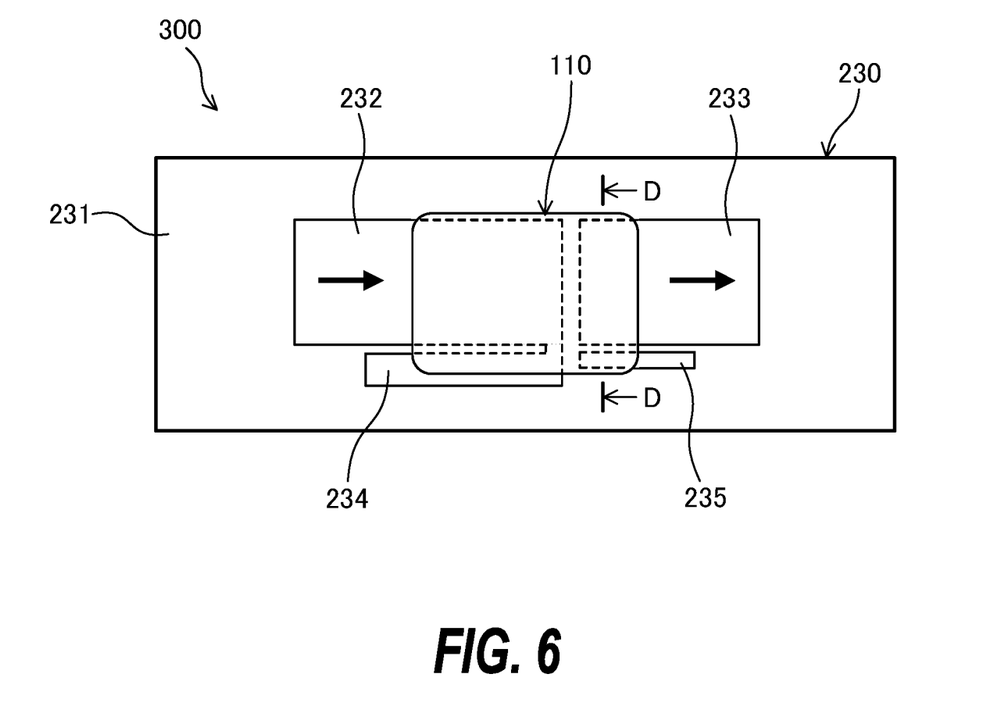
FIG. 6 is a diagram illustrating a mount structure for a current detection resistor according to a second embodiment of the present disclosure.
Figure 7:
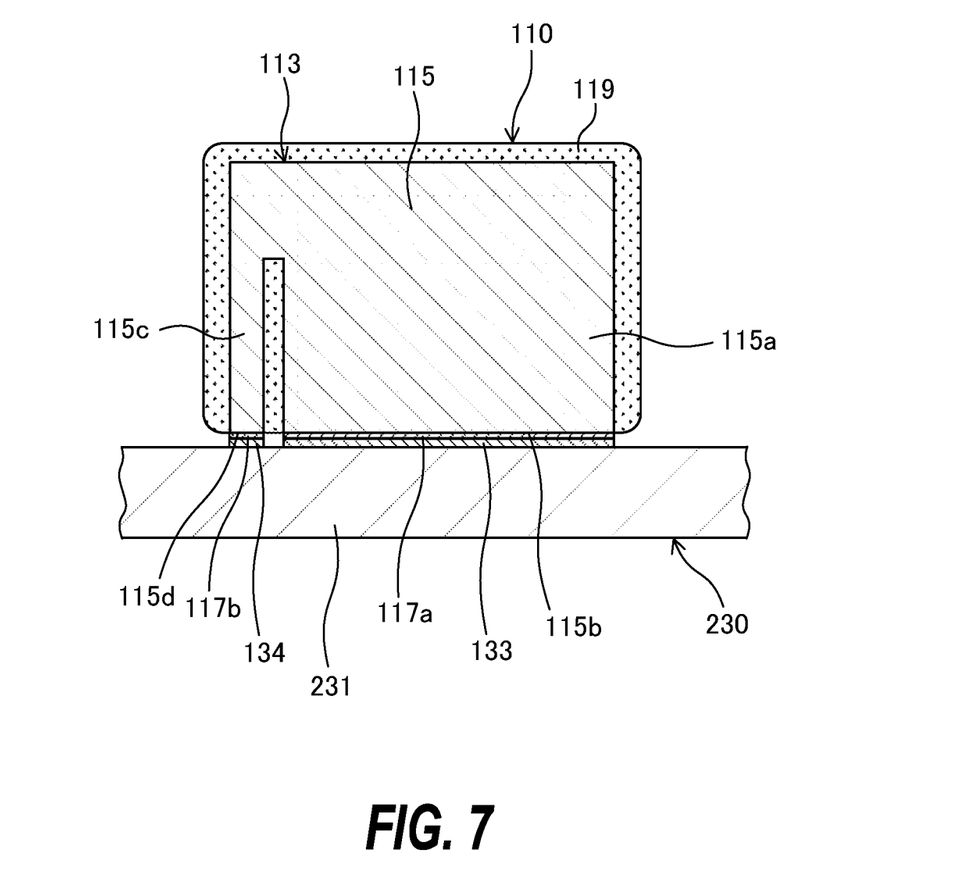
FIG. 7 is a cross-sectional view illustrating a cross section taken along line D-D in FIG. 6.

Next, a shunt resistor 110 according to a second embodiment will be described with reference to FIG. 6 and FIG. 7. FIG. 6 illustrates a mount structure 300 in which the shunt resistor 110 according to the second embodiment is mounted on a circuit board 230. FIG. 7 is a cross-sectional view illustrating a cross section taken along line D-D in FIG. 6. Points different from the first embodiment will be mainly described below, and configurations that are similar to those in the first embodiment will be denoted with the same reference numerals and the description thereof will be omitted.

The basic configuration of the shunt resistor 110 is the same as the shunt resistor 10 according to the first embodiment. The shunt resistor 110 is different from the shunt resistor 10 in that an extension portion 115 of a second electrode block 113 laminated on the upper surface of the resistive element 11 has a different shape.

As illustrated in FIG. 6 and FIG. 7, the circuit board 230 on which the shunt resistor 110 is mounted includes a substrate 231 and a first wiring pattern 232 and a second wiring pattern 233 provided to the substrate 231. The first wiring pattern 232 and the second wiring pattern 233 are formed to extend in directions to face each other with a predetermined gap in between. The first electrode block 12 of the shunt resistor 110 is connected to the first wiring pattern 232, the second electrode block 113 of the shunt resistor 110 is connected to the second wiring pattern 233, and current flows in a direction indicated by the arrows in FIG. 6.

The substrate 231 is provided with a first voltage terminal 234 branched off from the first wiring pattern 232, and a second voltage terminal 235 extending in parallel with the second wiring pattern 233.

As illustrated in FIG. 7, the extension portion 115 of the second electrode block 113 of the shunt resistor 110 has a lower portion branched into a first extension portion 115a connected to the second wiring pattern 233 and a second extension portion 115c connected to the second voltage terminal 235.

Thus, the second electrode block 113 of the shunt resistor 110 is directly connected to the second voltage terminal 235 via the second extension portion 115c formed in the extension portion 115, without involving a connection wire formed by wire bonding.

Thus, with the shunt resistor 110, the upper surface of the second electrode block 113 needs not to be exposed for the wire bonding, and thus the upper surface of the second electrode block 113 is also covered with the insulative material 119.

Plating layers 117a and 117b are respectively formed on the first lower end surface 115b of the first extension portion 115a and the second lower end surface 115d of the second extension portion 115c, as in the lower surface 12a of the first electrode block 12.

As in the first embodiment, an unillustrated current detection device is connected to the first voltage terminal 234 and the second voltage terminal 235, and calculates a value of current flowing in the shunt resistor 110 as indicated by the arrows in FIG. 6.

The second embodiment described above provides the effect provided by the first embodiment, and further provides the following effects.

In the shunt resistor 110, the second electrode block 113 and the second voltage terminal 235 are connected to each other using the second extension portion 115c formed by branching the extension portion 115, instead of using a connection wire formed by wire bonding. With the shunt resistor 110 thus soldered on the circuit board 230, the second electrode block 113 and the second voltage terminal 235 are connected to each other. With this configuration, the wire bonding needs not to be performed, whereby the mountability of the shunt resistor 110 on the circuit board 230 can be improved.

Next, another mount structure for the shunt resistor 110 according to the second embodiment will be described with reference to FIG. 8.

Figure 8:
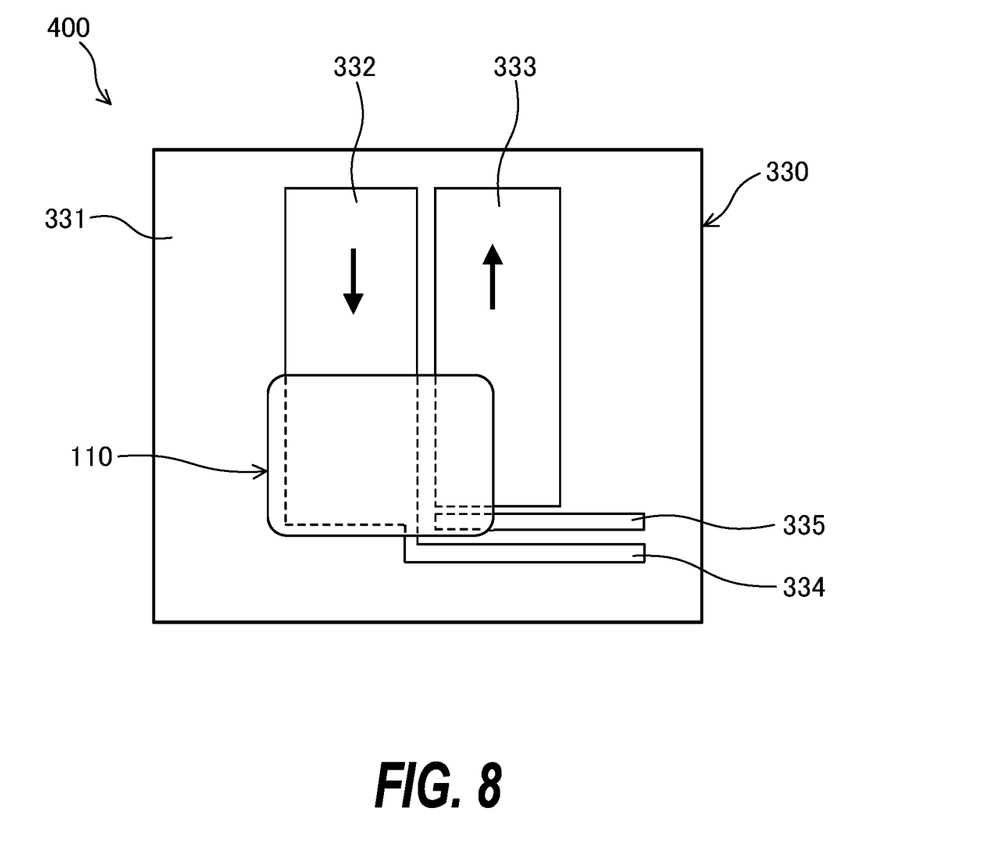
FIG. 8 is a diagram illustrating a modification of the mount structure for the current detection resistor according to the second embodiment of the present disclosure.

FIG. 8 illustrates a mount structure 400 different from the mount structure 300 described above. The mount structure 400 has the shunt resistor 110 having the configuration described above, mounted on a circuit board 330 different from the circuit board 230.

The circuit board 330 includes a substrate 331 and a first wiring pattern 332 and a second wiring pattern 333 provided to the substrate 331. The first wiring pattern 332 and the second wiring pattern 333 are formed to extend in parallel with each other.

The substrate 331 is provided with a first voltage terminal 334 branched off from the first wiring pattern 332, and a second voltage terminal 335 extending from a position opposite to the second extension portion 115c of the shunt resistor 110 having the configuration described above.

The shunt resistor 110 is mounted on the circuit board 330 with the lower surface 12a of the first electrode block 12 connected to the first wiring pattern 332, the first lower end surface 115b of the extension portion 115 connected to the second wiring pattern 333, and the second lower end surface 115d of the extension portion 115 connected to the second voltage terminal 135.

As in the second embodiment, an unillustrated current detection device is connected to the first voltage terminal 334 and the second voltage terminal 335, and calculates a value of the current flowing in the shunt resistor 110 as indicated by the arrows in FIG. 8.

In this modification, the first wiring pattern 332 in which the current toward the shunt resistor 110 flows and the second wiring pattern 333 in which the current flows after passing through the shunt resistor 110 are arranged parallel with each other.

Thus, a magnetic flux produced by the current flowing in the first wiring pattern 332 and a magnetic flux produced by the current flowing in the second wiring pattern 333 cancel each other out, whereby the inductance components of the first wiring pattern 332 and the second wiring pattern 333 are reduced. With the inductance components around the shunt resistor 110 thus reduced, the current detection accuracy can be improved even when high frequency current of 20 kHz or higher flows in the shunt resistor 110, for example.

The actions and effects of the shunt resistors 10, 110 in the above-described embodiments will be described below.

According to the present embodiment, the shunt resistor 10, 110 includes: the flat resistive element 11; the first electrode block 12 that is made of a conductive metal material and is laminated on the lower surface 11a of the resistive element 11; and the second electrode block 13, 113 that is made of a conductive metal material and is laminated on the upper surface 11b of the resistive element 11. The second electrode block 13, 113 is a block body including the electrode portion 14 connected to the resistive element 11 and the extension portion 15, 115 extending downward from a side surface of the electrode portion 14.

This configuration features, in particular, connection between the upper surface 11b of the resistive element 11 and the second wiring pattern 33, 133, 233, 333 established by the second electrode block 13, 113 which is a block body, instead of a connection wire formed by wire bonding.

With the upper surface 11b of the resistive element 11 and the second wiring pattern 33, 133, 233, 333 connected to each other using the block body with a large cross-sectional area instead of using a connection wire with a small cross-sectional area, a current path in which a relatively large current can flow can be secured. As a result, the relatively large current can flow in the shunt resistor 10, 110.

A plurality of connection wires need not to be bonded to the electrode provided on the upper surface 11b of the resistive element 11, and thus, the cross-sectional area of the resistive element 11 or the area of the electrode provided to the upper surface 11b of the resistive element 11 is reduced. Thus, even the shunt resistor 10, 110 used for detecting a relatively large current can be downsized. The shunt resistor 10, 110 thus downsized can be mounted on the circuit board 30, 130, 230, 330 with improved mountability.

According to the present embodiment, the lower end surface 15a, 115b of the extension portion 15, 115 and the lower surface 12a of the first electrode block 12 are connected to different wiring patterns, and the area of the lower end surface 15a, 115b of the extension portion 15, 115 is smaller than the area of the lower surface 12a of the first electrode block 12.

With the area of the lower end surface 15a, 115b of the extension portion 15, 115 connected to the second wiring pattern 33, 133, 233, 333 thus set to be smaller than the area of the lower surface 12a of the first electrode block 12 connected to the first wiring pattern 32, 132, 232, 332, the shunt resistor 10, 110 can have a shorter length in a direction in which the first electrode block 12 and the extension portion 15, 115 are arranged. As a result, the shunt resistor 10, 110 is downsized to be mountable on the circuit board 30, 130, 230, 330 with higher mountability.

According to the present embodiment, the lower end surface 15a, 115b of the extension portion 15, 115 and the lower surface 12a of the first electrode block 12 are on the same plane.

With the second electrode block 13, 113 including the extension portion 15, 115 thus being a block body, the position of the lower end surface 15a, 115b of the extension portion 15, 115 can be more accurately aligned with the position of the lower surface 12a of the first electrode block 12 compared with a case where the extension portion 15, 115 is formed by bending. With the lower end surface 15a, 115b of the extension portion 15, 115 and the lower surface 12a of the electrode block 12 thus positioned on the same plane to reduce the terminal flatness, the mountability of the shunt resistor 10, 110 on the circuit board 30, 130, 230, 330 can be improved.

According to the present embodiment, the area of the lower end surface 15a, 115b of the extension portion 15, 115 is larger than the area of the side surface 14a of the electrode portion 14.

With the area of the lower end surface 15a, 115b of the extension portion 15, 115 thus set to be larger than the area of the side surface 14a of the electrode portion 14 to reduce the resistance value of the extension portion 15, 115 in which the current flows after passing through the resistive element 11 and the electrode portion 14, the accuracy of the current detection using the shunt resistor 10, 110 can be improved.

According to the present embodiment, the area of the cross section, of a portion of the extension portion 15, 115 extending in parallel with the laminating direction, orthogonal to the laminating direction is uniform across the section reaching the lower end surface 15a, 115b.

With the area of the cross section, of the portion extending in parallel with the laminating direction, orthogonal to the laminating direction of the extension portion 15, 115 thus being uniform across the section reaching the lower end surface 15a, 115b, the shunt resistor 10, 110 can be downsized without the resistance value of the extension portion 15, 115 being excessively large. As a result, mountability of the shunt resistor 10, 110 onto the circuit board 30, 130, 230, 330 can be improved.

According to the present embodiment, the thickness of the electrode portion 14 is set such that the resistance value of the electrode portion 14 is set to be 10% or less of the resistance value of the resistive element 11.

With the thickness of the electrode portion 14 thus set such that the resistance value of the electrode portion 14 is set to be 10% or less of the resistance value of the resistive element 11 to limit the resistance value of the electrode portion 14 in which the current flows after passing through the resistive element 11 below a predetermined magnitude, the accuracy of the current detection using the shunt resistor 10, 110 can be improved.

According to the present embodiment, the specific resistance of the resistive element 11 is equal to or larger than 200 μΩ·cm and equal to or less than 30000 μΩ·cm.

With the specific resistance of the resistive element 11 being thus set to be in a range from 200 μΩ·cm to 30000 μΩ·cm both inclusive, the resistive element 11 can have a resistance value sufficient for current detection even in the shunt resistor 10, 110 of a vertical structure in which the resistive element 11 is thin. Furthermore, with the specific resistance of the resistive element 11 thus being a relatively large value, a signal level of detected voltage increases, leading to a higher signal to noise ratio (S/N ratio) of the detected voltage. As a result, the accuracy of the current detection using the shunt resistor 10, 110 can be improved.

According to the present embodiment, the resistive element 11 includes: insulative particles formed from at least one selected from the group consisting of alumina, aluminum nitride, silicon nitride, and zirconia; and a metallic body formed from at least one selected from the group consisting of nichrome, copper manganese, and copper nickel.

With the resistive element 11 thus configured by a metallic body involving a small change in resistance value due to temperature change and insulative particles with low coefficient of thermal expansion, the resistance value of the resistive element 11 can be approximated to the resistance value required for current detection. Furthermore, with the thermal stress approximated to the thermal stress of the substrate 31, 131, 231, 331, generation of cracks between resistive element 11 and the substrate 31, 131, 231, 331 due to heat cycle can be suppressed.

According to the present embodiment, the resistive element 11, the first electrode block 12, and the second electrode block 13, 113 are formed by molding the insulative material 19, 119.

With the side surfaces of the resistive element 11, the first electrode block 12, and the second electrode block 13, 113 thus covered with the insulative material 19, 119, even in the shunt resistor 10, 110 of the vertical structure, the short circuiting between the first electrode block 12 and the second electrode block 13, 113 due to solder fillet produced during the mounting can be prevented.

With the shunt resistor 10, 110 formed as an integral configuration by molding, the shunt resistor 10, 110 can be easily mounted by placing the shunt resistor 10, 110 on the substrate 31, 131, 231, 331 and performing soldering. As described above, the shunt resistor 10, 110 features excellent mountability and is easy to handle and manage, so that the manufacturing cost of the mount structure 100, 200, 300, 400 can be reduced.

According to the present embodiment, the second electrode block 13 is formed by molding in a state of being at least partially exposed.

With the second electrode block 13 thus formed by molding while being at least partially exposed, the connection wire 36 can be bonded on a surface of the second electrode block 13. Thus, the voltage signal for detecting current flowing in the shunt resistor 10 can be easily extracted from the second electrode block 13.

While embodiments of the present disclosure have been described above, the embodiments only illustrate part of application examples of the present disclosure and are not intended to limit the technical scope of the present disclosure to the embodiments described above.

The present application claims priority to Japanese Patent Application No. 2019-78735 filed with the Japan Patent Office on Apr. 17, 2019, and all the contents of which are hereby incorporated by reference.

The invention claimed is:

1. A current detection resistor comprising:
   a flat resistive element;
   a first electrode block that is made of a conductive metal material and is laminated on a lower surface of the resistive element; and
   a second electrode block that is made of a conductive metal material and is laminated on an upper surface of the resistive element wherein,
   the second electrode block is a block body including an electrode portion connected to the resistive element and an extension portion extending downward from a side surface of the electrode portion; wherein
   a lower end surface of the extension portion and a lower surface of the first electrode block are connected to different pieces of wiring; and wherein
   an area of the lower end surface of the extension portion is smaller than an area of the lower surface of the first electrode block.

2. The current detection resistor according to claim 1, wherein the lower end surface of the extension portion and the lower surface of the first electrode block are on a same plane.

3. The current detection resistor according to claim 2, wherein an area of the lower end surface of the extension portion is larger than an area of the side surface of the electrode portion.

4. The current detection resistor according to claim 2, wherein an area of a cross section of a portion of the extension portion extending in parallel with a laminating direction, the cross section being orthogonal to the laminating direction, is uniform across a section reaching the lower end surface.

5. The current detection resistor according to claim 1, wherein a thickness of the electrode portion is set such that a resistance value of the electrode portion is set to be 10% or less of a resistance value of the resistive element.

6. The current detection resistor according to claim 1, wherein a specific resistance of the resistive element is equal to or larger than 200 µΩ·cm and equal to or less than 30000 µΩ·cm.

7. The current detection resistor according to claim 1, wherein the resistive element includes:
   insulative particles formed from at least one selected from the group consisting of alumina, aluminum nitride, silicon nitride, and zirconia; and
   a metallic body formed from at least one selected from the group consisting of nichrome, copper manganese, and copper nickel.

8. The current detection resistor according to claim 1, wherein a side surface of the resistive element, the first electrode block, and the second electrode block is covered by an insulative material over an entire circumference, and a gap between the resistive element and the first block and the extension portion is filled with the insulative material.

9. The current detection resistor according to claim 8, wherein the lower surface of the first electrode block is exposed without being covered by the insulative material.

\* \* \* \* \*